(12) United States Patent
Condrashoff et al.

(10) Patent No.: US 7,845,309 B2
(45) Date of Patent: Dec. 7, 2010

(54) ULTRA HIGH SPEED UNIFORM PLASMA PROCESSING SYSTEM

(75) Inventors: Robert S. Condrashoff, Walnut Creek, CA (US); James P. Fazio, Concord, CA (US); James D. Getty, Vacaville, CA (US); James S. Tyler, Galt, CA (US)

(73) Assignee: Nordson Corporation, Westlake, OH (US)

( * ) Notice: Subject to any disclaimer, the term of this patent is extended or adjusted under 35 U.S.C. 154(b) by 260 days.

(21) Appl. No.: 10/710,457

(22) Filed: Jul. 13, 2004

(65) Prior Publication Data
US 2006/0011299 A1 Jan. 19, 2006

(51) Int. Cl.
*C23C 16/50* (2006.01)
*C23C 16/503* (2006.01)
*C23C 16/509* (2006.01)
*H01L 21/306* (2006.01)
*C23F 1/00* (2006.01)
*C23C 16/06* (2006.01)
*C23C 16/22* (2006.01)

(52) U.S. Cl. .................... 118/723 E; 156/345.43; 156/345.44; 156/345.45; 156/345.47

(58) Field of Classification Search .............. 118/723 E, 118/723 ER; 156/345.43–345.47
See application file for complete search history.

(56) References Cited

U.S. PATENT DOCUMENTS

| 4,367,114 | A | | 1/1983 | Steinberg et al. ............ 156/345 |
|---|---|---|---|---|
| 4,381,965 | A | * | 5/1983 | Maher et al. ............ 156/345.45 |
| 4,786,359 | A | * | 11/1988 | Stark et al. .................. 438/710 |
| 5,534,751 | A | | 7/1996 | Lenz et al. ............. 315/111.71 |
| 5,605,637 | A | | 2/1997 | Shan et al. ..................... 216/71 |
| 5,711,811 | A | * | 1/1998 | Suntola et al. .............. 118/719 |
| 5,891,350 | A | * | 4/1999 | Shan et al. ..................... 216/71 |
| 6,051,100 | A | | 4/2000 | Walko, II ..................... 156/345 |
| 6,091,045 | A | | 7/2000 | Mabuchi et al. ........ 219/121.43 |
| 6,178,919 | B1 | | 1/2001 | Li et al. ...................... 118/723 |
| 6,251,216 | B1 | * | 6/2001 | Okamura et al. ......... 156/345.1 |

(Continued)

FOREIGN PATENT DOCUMENTS

JP 62-095828 5/1987

(Continued)

OTHER PUBLICATIONS

Tyler et al., *United States Patent Application Publication No. US 2003/0196760*, Publication Date: Oct. 23, 2003.

(Continued)

*Primary Examiner*—Rudy Zervigon
(74) *Attorney, Agent, or Firm*—Wood, Herron & Evans, LLP

(57) ABSTRACT

An apparatus for processing a substrate with a plasma. The apparatus includes first and second electrodes positioned with a spaced apart relationship. A separating ring has a vacuum-tight engagement with confronting surfaces of the first electrode and the second electrode to define an evacuable processing region therebetween. Communicating with the processing region is a process gas port for introducing a process gas to the processing region. The processing region may be evacuated through a vacuum port defined in one of the first and second electrodes to a pressure suitable for exciting a plasma from the process gas in the processing region when the first and second electrodes are powered.

14 Claims, 10 Drawing Sheets

U.S. PATENT DOCUMENTS

| | | | |
|---|---|---|---|
| 6,403,491 B1 | 6/2002 | Liu et al. | 438/710 |
| 6,700,089 B1 * | 3/2004 | Hirooka | 219/121.4 |
| 6,744,212 B2 | 6/2004 | Fischer et al. | 315/111.21 |
| 2002/0127853 A1 | 9/2002 | Hubacek et al. | 438/689 |
| 2004/0118344 A1 | 6/2004 | Ni et al. | 118/723 |

FOREIGN PATENT DOCUMENTS

| | | |
|---|---|---|
| JP | 62-299031 | 12/1987 |

OTHER PUBLICATIONS

European Patent Office, Partial European Search Report in Corresponding European Patent Application No. EP05014248, Mailing Date: Feb. 9, 2006.

European Patent Office, European Search Report in corresponding Application No. EP 05 01 4248 dated Sep. 13, 2006 (6 pages).

* cited by examiner

ULTRA HIGH SPEED UNIFORM PLASMA PROCESSING SYSTEM

FIELD OF THE INVENTION

The invention generally relates to processing apparatus for processing substrates with a plasma.

BACKGROUND OF THE INVENTION

Plasma processing systems are commonly used for modifying the surface properties of substrates in various industrial applications. For example, plasma processing systems are routinely used to plasma treat the surfaces of integrated circuits, electronic packages, and printed circuit boards in semiconductor applications, solar panels, hydrogen fuel cell components, automotive components, and rectangular glass substrates used in flat panel displays. Plasma processing systems are also used in medical applications to modify the surface properties of devices, such as stents and implants, inserted into the human body. Plasma processing systems that rely on conventional parallel-plate type electrodes may experience process non-uniformities across the surface of relatively large substrates positioned in a processing region defined between the electrodes for processing.

When radio frequency power is supplied to the electrodes, equipotential field lines are induced across the surface of the substrate. During plasma processing, positive ions from the plasma in the processing region accelerate across the equipotential field lines to impinge on the surface of the substrate. The plasma is typically distributed over the entire evacuated volume of a processing chamber enclosing the electrodes with the highest plasma density observed between the electrodes. The uniformity of the plasma density in the processing region between the electrodes is influenced by external field effects factors, such as grounded chamber sidewalls, that alter the equipotential electric field lines between the electrodes and thereby modify the distribution of the constituent charged components of the plasma. The non-uniformity may be particularly significant at the peripheral edges of the processing region.

One conventional method of reducing external field effects is to make the processing chamber larger so that the grounded sidewalls are more distant from the electrodes. Among other disadvantages, this increases the chamber volume and the footprint of the processing system. The increase in chamber volume increases the time to evacuate the processing chamber and the time to bleed or vent the processing chamber to atmospheric pressure to insert unprocessed substrates or remove processed substrates. In particular, these are especially undesirable effects that significantly reduce throughput in in-line plasma processing systems intended to serially plasma process large quantities of substrates, which requires periodic evacuation and venting to exchange substrates after each processing cycle.

Another disadvantage of conventional plasma processing systems is that plasma is inadvertently generated in evacuated regions inside the processing chamber peripheral to the processing region between the electrodes. The generation of plasma in these regions renders the plasma process difficult to control and may damage components positioned within these regions. This unconfined plasma may also change the location of power absorbed by the plasma within the plasma processing chamber, thereby making it difficult to control the delivery of power to the electrodes to achieve consistent and reproducible processing.

Conventional approaches for confining the plasma generally include the use of repulsive fields, either electric or magnetic in nature. One specific conventional approach is to position confinement rings about the outer periphery of the parallel-plate type electrodes. The confinement rings, which are formed from an electrical insulator, charge to a potential comparable to that of the plasma, which generates a repulsive electric field that laterally confines the plasma. Nonetheless, the electrodes and confinement rings are still positioned inside of, and surrounded by, a considerably larger vacuum chamber that must be evacuated and in which a plasma discharge may still exist. The confinement rings are arranged with gaps so that the processing region defined between the electrodes is adequately evacuated.

It would therefore be desirable to provide a plasma processing system that overcomes these and other deficiencies of conventional plasma processing systems, as described herein.

SUMMARY OF INVENTION

In an embodiment of the invention, an apparatus for plasma processing a substrate includes first and second electrodes positioned with a spaced apart relationship and a separating ring having a vacuum-tight engagement with confronting surfaces of the first electrode and the second electrode to define an evacuatable vacuum processing region between the first electrode and the second electrode. Either the first electrode or the second electrode is adapted to support the substrate in the processing region for plasma processing. The separating ring electrically isolates the first electrode from the second electrode. The apparatus further includes a process gas port for introducing a process gas to the processing region and a vacuum port for evacuating the processing region to a pressure suitable for generating a plasma from the process gas in the processing region when the first and/or second electrodes are powered.

These and other objects and advantages of the present invention shall become more apparent from the accompanying drawings and description thereof.

BRIEF DESCRIPTION OF DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
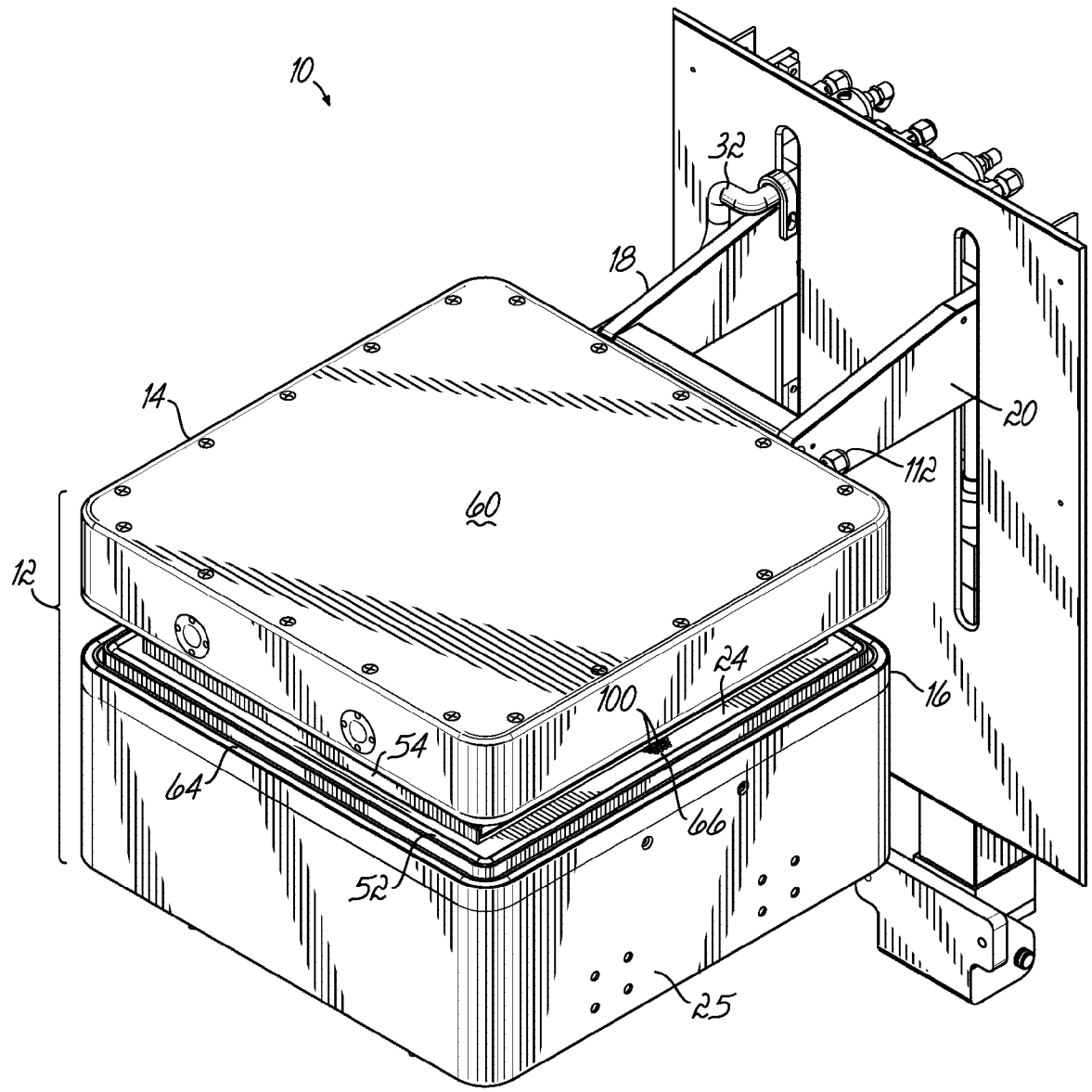
FIG. 1 is a perspective view of a plasma processing system in accordance with an embodiment of the invention.
Figure 2:
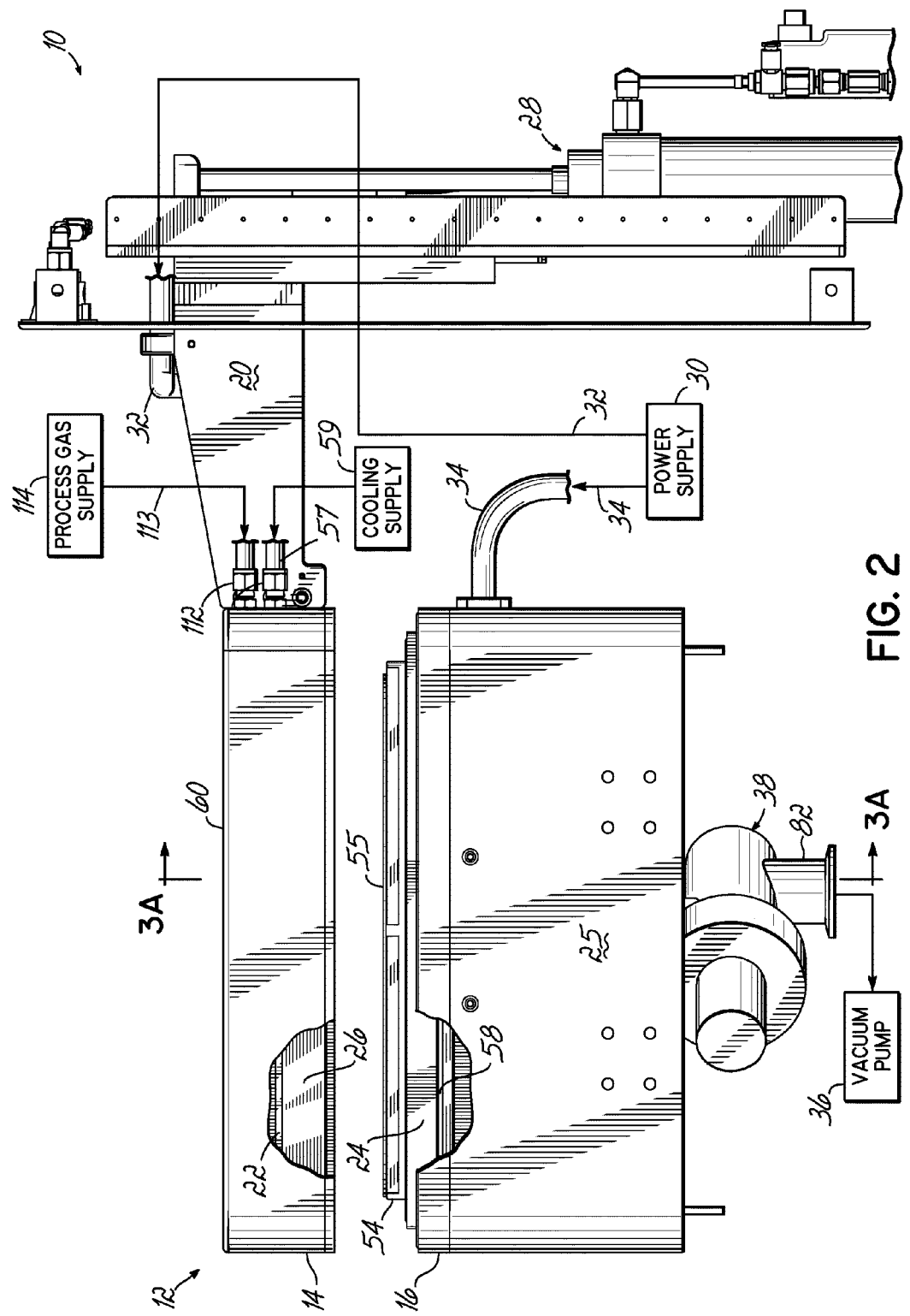
FIG. 2 is a side view of the plasma processing system of FIG. 1.

With reference to FIGS. 1 and 2, a plasma processing system 10 generally includes an enclosure 12 having a lid 14 and a base 16 upon which the lid 14 rests, a pair of support arms 18, 20 depending from the lid 14, an upper electrode 22, and a lower electrode 24. The processing system 10 further includes a separating member or ring 26 positioned between the upper and lower electrodes 22, 24 and contacting confronting faces about the perimeter of the upper and lower electrodes 22, 24. The confronting faces of the electrodes 22, 24 are generally planar and parallel plates and have approximately identical surface areas. A shroud 25 extends downwardly from the base 16 toward the surface supporting system 10.

Figure 3A:
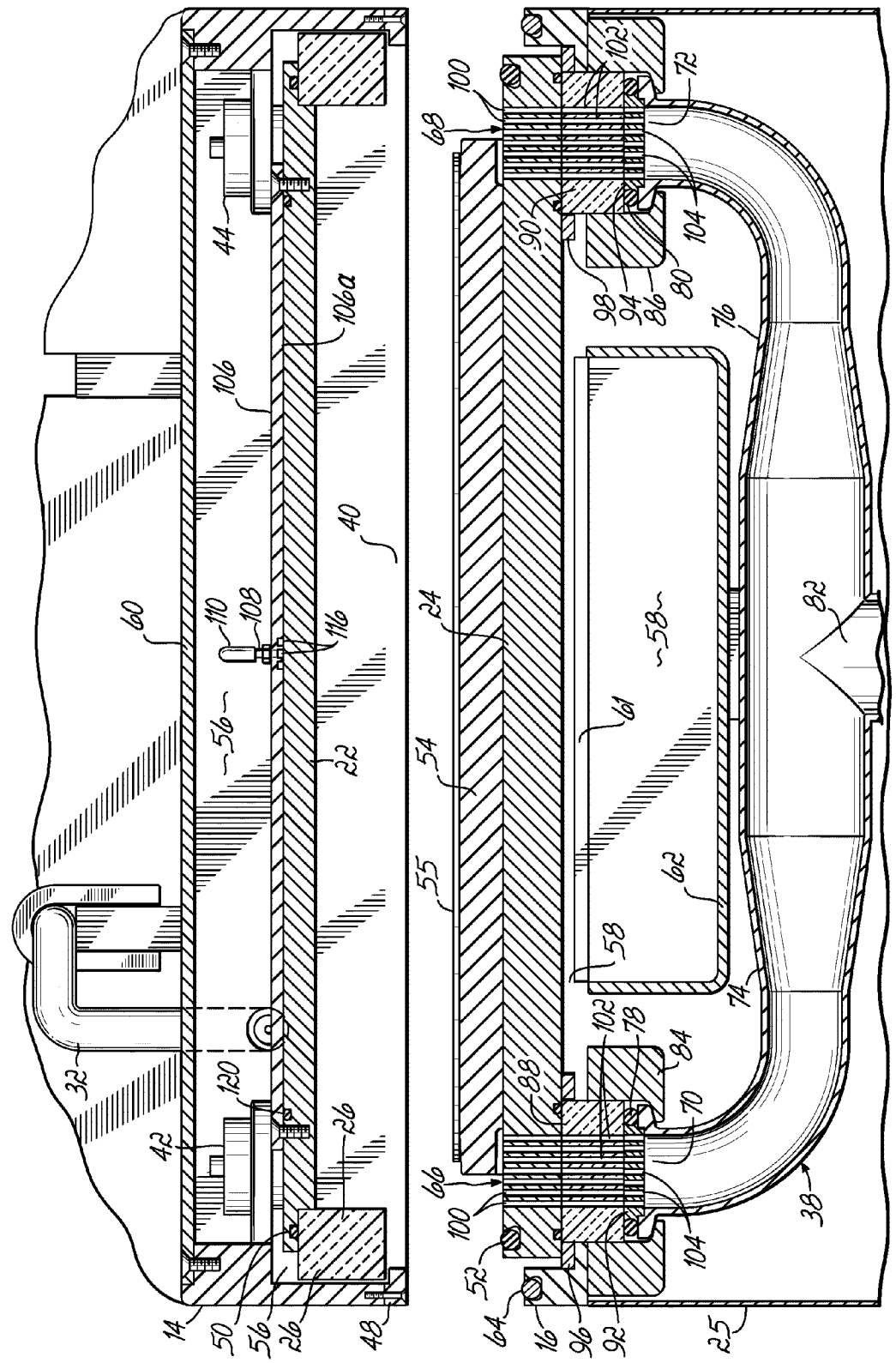
FIG. 3A is a front cross-sectional view of the plasma processing system of FIGS. 1 and 2.
Figure 3B:
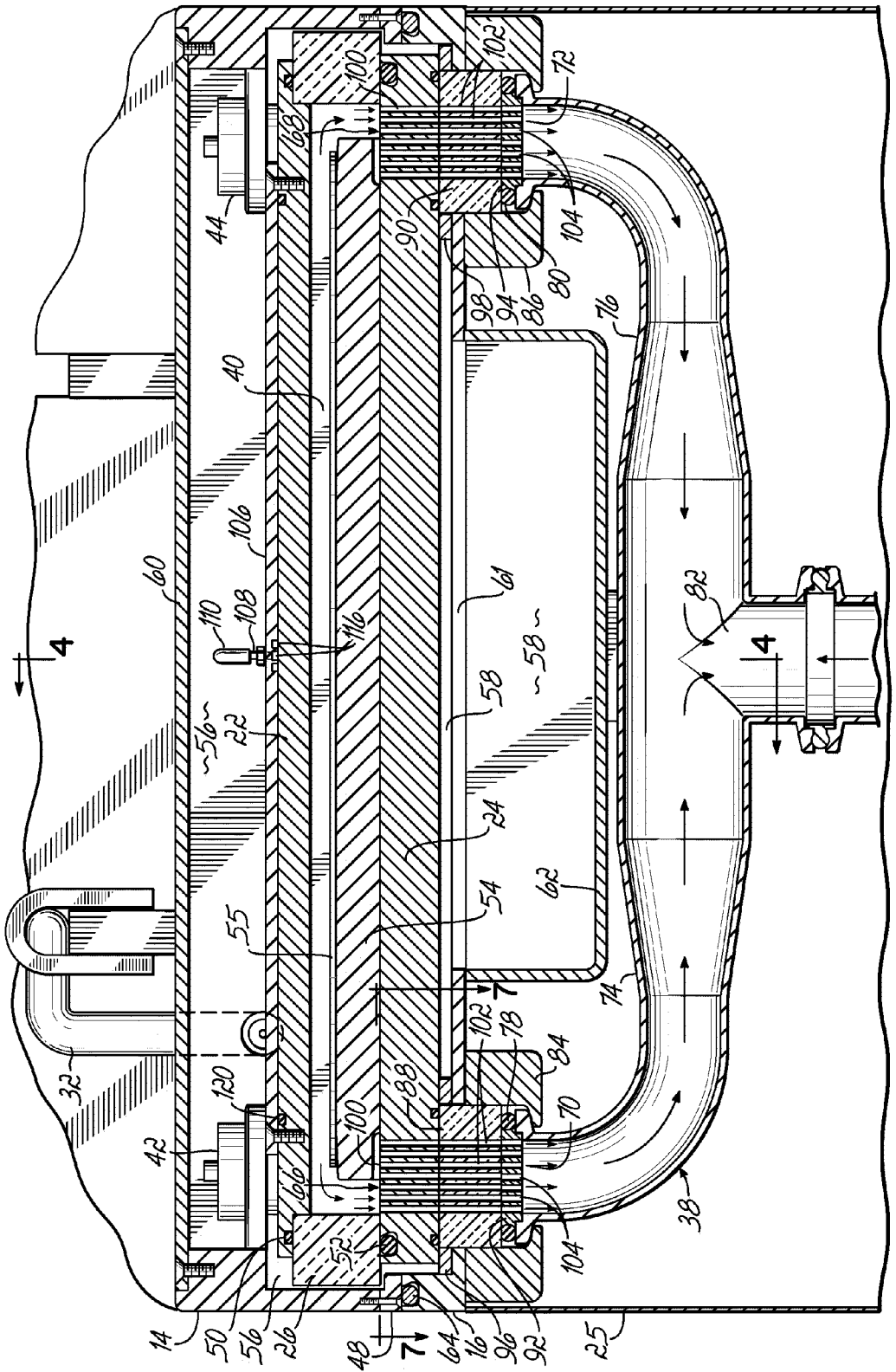
FIG. 3B is a cross-sectional view similar to FIG. 3A shown with the enclosure lid engaged with the enclosure base.

Mechanically coupled with the support arms 18, 20 is a lifting device 28, illustrated as a pneumatic cylinder, that vertically lifts and lowers the lid 14 relative to the base 16 between a raised position (FIG. 3A) and a lowered position (FIG. 3B). In the raised position, a processing region 40 (FIG. 3B), as defined below, is accessible for inserting unprocessed substrates 55 and removing processed substrates 55. In the lowered position (FIG. 3B), an environment may be established in the processing region 40 that is suitable for plasma processing a substrate 55 positioned in the processing region 40. The invention contemplates that the processing region 40 may be accessed in any alternative manner understood by persons of ordinary skill in the art, such as a hinged connection that pivots the lid 14 relative to base 16.

For in-line applications, the processing system 10 may be provided with an input carrier that provides unprocessed substrates 55, an output carrier that receives processed substrates 55, and a transfer arm or the like for transferring substrates 55 from the input carrier to the process chamber and from the process chamber to the output carrier. In addition, a plurality of discrete substrates 55 may be introduced in such a way that each substrate 55 within the plurality is independently introduced into the processing system 10 or in such a way that one or more substrates 55 within the plurality are jointly introduced into the processing system 10. Discrete substrates 55 may also be positioned on a support or carrier and transported thereon into the processing system. The processing system 10 may comprise a single process station among multiple process stations that cooperate to sequentially process multiple substrates 55 moving in an assembly line fashion among the multiple process stations.

A power supply 30, which is coupled with the electrodes 22, 24 by shielded coaxial cables or transmission lines 32, 34, respectively, controls the power level and frequency of operation of the electrodes 22, 24. The power supply 30 may be an alternating current power supply operating at an extremely low frequency, such as 50 Hz and 60 Hz, at a high radio frequency, such as 40 kHz and 13.56 MHz, at a medium radio frequency, such as 1 kHz, or at a microwave frequency, such as 2.4 GHz. The power supply 30 may also operate at dual frequencies superimposed upon one another. Alternatively, the power supply 30 may be a direct current (DC) power supply in which the plasma is non-oscillating. In other alternative embodiments, power supply 30 may supply a radio frequency (RF) power component that provides a dense plasma and a DC power component that independently increases ion energy without effecting the plasma density.

In certain embodiments of the invention, the power supply 30 may operated at one or more radio frequencies and include an impedance matching network (not shown) that measures reflected power from the load represented by the electrodes 22, 24 and plasma confined therebetween back to the power supply 30. The impendence matching network adjusts the frequency of operation of power supply 30 to minimize the reflected power. The construction of such matching networks is understood by a person of ordinary skill in the art. For example, the impedance matching network may tune the matching network by changing the capacitance of variable capacitors within the matching network to match the impedance of the power supply 30 to the impedance of the load as the load changes. The power and voltage levels and operating frequency(ies) may vary of course, depending upon the particular application.

A vacuum pump 36 continuously pumps byproduct generated by the plasma process and non-reacted process gas from the processing region 40, when the plasma processing system 10 is operating, through a vacuum manifold 38. The vacuum pump 36 is operative to maintain the total pressure in the processing region 40 at a subatmospheric level low enough to facilitate creation of a plasma. Typically pressures suitable for plasma formation range from about twenty (20) millitorr to greater than about fifty (50) torr. The pressure within the processing region 40 is controlled in accordance with a particular desired plasma process and primarily consists of partial pressure contributions from the process gas, which may comprise one or more individual gas species, supplied to the evacuated processing region 40.

The plasma processing system 10 includes a microprocessor-based controller that is programmed to control the operation of, among other components, the power supply 30, the vacuum pump 36, and the process gas supply 114. For example, the controller regulates the power levels, voltages, currents and frequencies of the power supply 30 and orchestrates the provision of process gas from process gas supply 114 and the pumping rate of vacuum pump 36 to define a suitable pressure in processing region 40 in accordance with the particular plasma process and application.

During processing of substrate 55, the power applied between the electrodes 22, 24 by power supply 30 produces an electromagnetic field in a processing region 40 (FIGS. 3B and 4) defined between the two electrodes 22, 24, as described below, when the lid 14 and base 16 are contacting and an environment suitable for plasma processing is provided. The electromagnetic field excites the process gas present in the processing region to a plasma state, which is sustained by the application of power from power supply 30 for the duration of the plasma treatment.

Constituent components of the plasma interact with exposed material on the substrate 55 to perform the desired surface modification. The plasma is configured to perform the desired surface modification of the substrate 55 by selecting parameters such as the chemistry of the process gas, the pressure inside the processing region 40, and the amount of power and/or frequency applied to the electrodes 22, 24. The processing system 10 may include an end point recognition system (not shown) that automatically recognizes when a plasma process (e.g., an etching process) has reached a predetermined end point or, alternatively, plasma processes may be timed based upon an empirically-determined process time.

Figure 4:
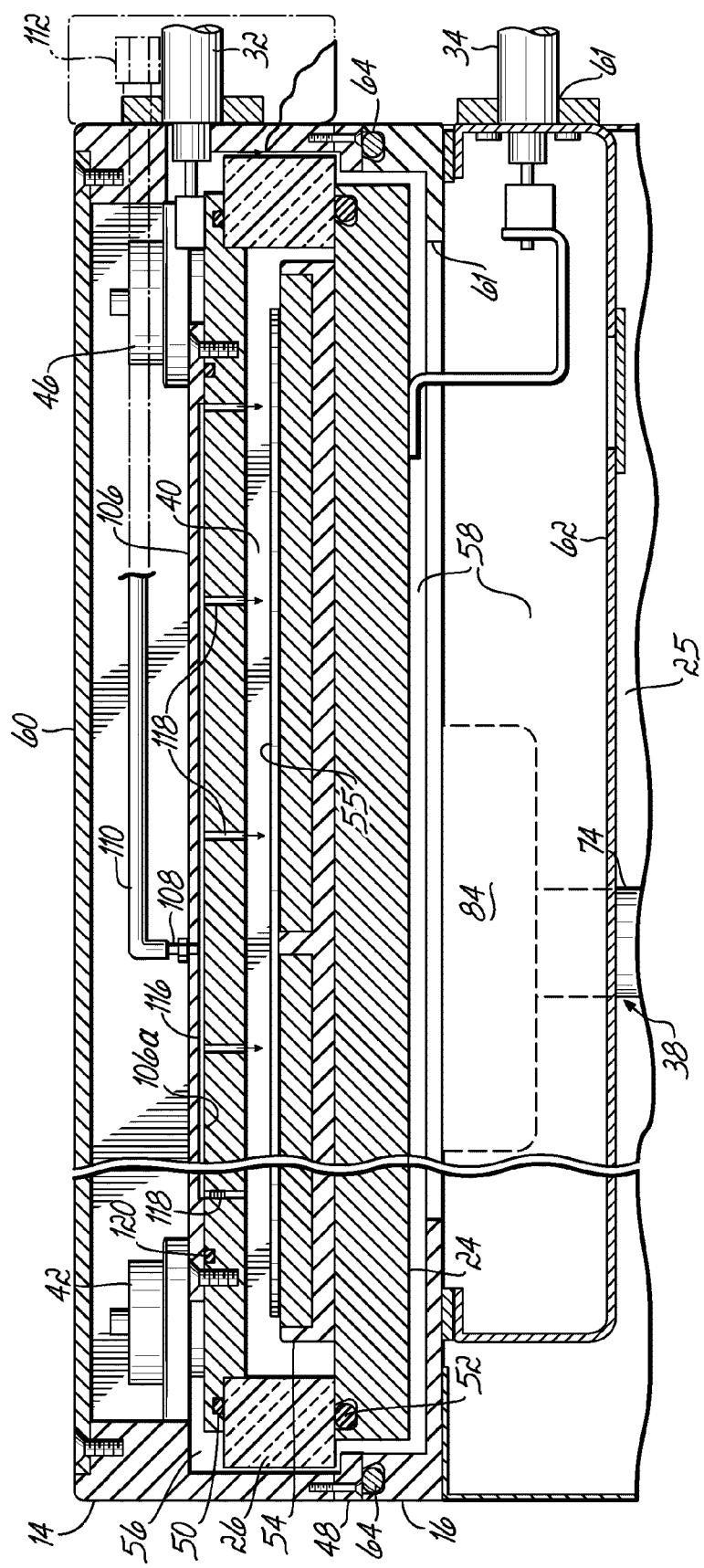
FIG. 4 is a side cross sectional view of the plasma processing system of FIG. 1.

With reference to FIGS. 3A and 3B, the upper electrode 22 is suspended from the upper housing by a plurality of electrically insulating spacers, of which spacers 42 and 44 are visible in FIG. 3A and spacer 46 is visible in FIG. 4. In one embodiment of the invention in which the upper electrode 22 is rectangular, insulating spacers similar to spacers 42, 44 and 46 are positioned between each corner of upper electrode 22 and each corner of the lid 14. Secured by conventional fasteners to the perimeter of the lid 14 is a retaining ring 48 that operates to secure the separating ring 26 to the lid 14. As a result, the upper electrode 22 and the retaining ring 48 move along with the lid 14 when the lid 14 is moved by the lifting device 28 between the raised and lowered positions relative to the base 16.

A sealing member 50 is compressed between separating 26 and the upper electrode 22 by a vertical force applied by the retaining ring 48 when fastened to the lid 14. When the lid 14 is lowered into contact with the base 16 as shown in FIG. 3B, a sealing member 52 is compressed between the separating ring 26 and a perimeter of the lower electrode 24. The sealing members 50, 52 are illustrated as conventional elastomeric O-rings, although the invention is not so limited.

Mounted to the lower electrode 24 is a substrate holder 54 configured to support either one or more substrates or one or more carriers each bearing one or more substrates 55 at locations inside the processing region 40 suitable for plasma treatment. The substrate holder 54 has a good electrical contact with the lower electrode 24 so that the substrate holder 54 and substrates 55 are at the same potential as the lower electrode 24. However, the invention is not so limited as, in an alternative embodiment, the substrate holder 54 may be at a floating potential and electrically insulated from the lower electrode 24. The invention also contemplates that the substrate 55 may be supported from the upper electrode 22 or by the separating ring 26. When the lid 14 and base 16 are contacting, the processing region 40 is defined as the space bounded vertically between the inwardly-facing horizontal surfaces of the electrodes 22, 24 and bounded laterally inside the inwardly-facing vertical surface of the sidewall defined by the separating ring 26.

The base 16 includes an opening 61 over which is positioned a base thin-walled metallic closure 62, which constitutes a component of the enclosure 12. An unpumped atmospheric-pressure cavity or air gap 58 is defined between the lower electrode 24 and the assembly of the base 16 and the closure 62, respectively. Another unpumped atmospheric-pressure cavity or air gap 56 is defined between the lid 14, a lid cover 60 removable from lid 14, and the upper electrode 22. Typically, the air gaps 56, 58 are dimensioned to minimize energy loss from the electrodes 22, 24 to the lid 14, base 16 and closure 62 and are coupled together as a single, continuous air-filled space by portions of gaps 56, 58 encircling the perimeter of the electrodes 22, 24 and separating ring 26, as best depicted in FIG. 3B.

When the lid 14 is in its lowered position, a conducting member 64 captured between the respective perimeters of the lid 14 and base 16, which are metallic, supplies a good electrical contact between the lid 14 and base 16. The lid 14, base 16, cover 60, and closure 62 collectively define a substantially closed electrically conducting shell, which acts as a shield to confine power supplied to the electrodes 22, 24 within the interior of the enclosure 12.

Transmission line 34, which is electrically coupled in a known manner with the lower electrode 24, is routed through opening 61 to lower electrode 24. Transmission line 32 enters the lid 14 at a location between the removable lid cover 60 and the upper electrode 22, and is electrically coupled in a known manner with the upper electrode 22. If both electrodes 22, 24 are coupled with the power supply 30 and the power supply 30 is an alternating current power supply, one of the electrodes 22, 24 may be driven 180° out of phase from the other of the electrodes 22, 24 so that both electrodes 22, 24 are powered. Alternatively, one of the electrodes 22, 24 may be grounded and the other of the electrodes 22, 24 may be powered.

In certain embodiments of the invention, an appropriate cooling fluid may be circulated through these air gaps 56, 58 for cooling the processing system 10 and, in particular, for cooling the electrodes 22, 24. To that end, a fitting 57 (FIG. 2) may be provided in the lid 14 to define a coolant port for coupling a coolant supply 59 (FIG. 2) with air gap 56. A forced flow of a coolant, such as air, may be introduced from the coolant supply 59 to air gap 56 via fitting 57 to establish a continuous coolant flow about the electrodes 22, 24 through air gaps 56, 58. Air gap 58 is structured to provide an exhaust path for the flowing coolant to the open environment about the processing system 10.

The volume bounded by the electrodes 22, 24 and the separating ring 26 constitutes the processing region 40 and represents the only volume, aside from the vacuum manifold 38, in the processing system 10 that is evacuated by the vacuum pump 36 and, hence, represents the vacuum envelope of the plasma processing system 10. This is in marked contrast to conventional plasma processing systems in which electrodes are positioned inside a vacuum chamber with a significant evacuated volume surrounding the electrodes in which the process gas may be excited to provide an unconfined plasma that uses available power but is otherwise not available for processing workpieces 55 positioned between the electrodes 22, 24. As a result, the effective evacuated volume of system 10 is significantly smaller than the evacuated volume of conventional processing chambers. This provides multiple benefits including, but not limited to, an increased plasma density, a significant reduction in the time required to evacuate the processing chamber to a pressure suitable for exciting the plasma, and a significant reduction in the time required to bleed or vent the processing chamber to atmospheric pressure. These benefits contribute to an increased throughput with decreased cost of operation and a reduced processing time required to provide a targeted plasma treatment as compared with conventional plasma processing systems.

The electrodes 22, 24 are formed from an electrically-conductive material, such as aluminum. The separating ring 26 is formed from a non-conducting dielectric material that is able to withstand the plasma environment inside the processing region 40 without unduly contaminating the processed substrate 55. Generally, this implies that the material forming the separating ring 26 should be substantially resistant to etching by the plasma present in the processing region 40. The separating ring 26 defines a vertical sidewall of non-conductive material, in addition to providing the vacuum seal between the electrodes 22, 24.

The absence of a conventional vacuum chamber eliminates or, at the least, significant reduces external field effects. More specifically, the electrodes 22, 24 of plasma processing system 10 are not surrounded by grounded metallic walls characterizing a conventional vacuum chamber. Instead, the non-conducting separating ring 26 effectively operates as the vertical sidewall boundary of the processing region 40. Therefore, external field effects are minimized or absent and the equipotential electric field lines are uniform across the entire surface of the substrate 55 without fringing at the electrode edges, which allows plasma processing to proceed in a uniform manner across the substrate 55.

In one embodiment, jade glass (i.e., calcium magnesium iron silicate or sodium aluminum iron silicate) is employed as the dielectric material for separating ring 26 but another ceramic material, such as alumina, float glass, silica or quartz, may also be used. In alternative embodiments of the invention, the dielectric material constituting separating ring 26 may any of a number of polymeric fluorocarbon materials including but not limited to polytetrafluoroethylene (PTFE), the homopolymer of tetrafluoroethylene sold under the trademark TEFLON by DuPont; perfluorinated ethylene-propylene (FEP), the copolymer of tetrafluoroethylene and hexafluoropropylene sold under the trademark TEFLON FEP by DuPont; perfluoroalkoxy fluorocarbon resin (PFA), the copolymer of tetrafluoroethylene-perfluorovinyl ether sold under the trademark TEFLON PFA by DuPont; or ethylene tetrafluoroethylene (ETFE), the copolymer of ethylene and tetrafluoroethylene sold under the trademark TEFZEL by DuPont. Use of such polymers to construct separating ring 26 may be appropriate, for example, in etching applications with plasma species capable of chemically attacking ceramics. Because the separating ring 26 constitutes a portion of the vacuum envelope of the processing region 40, the separating ring 26 should be engineered with a strength sufficient to withstand the external forces arising from the pressure differential between the evacuated processing region 40 and the atmospheric pressure in air gaps 56, 58.

Figure 5:
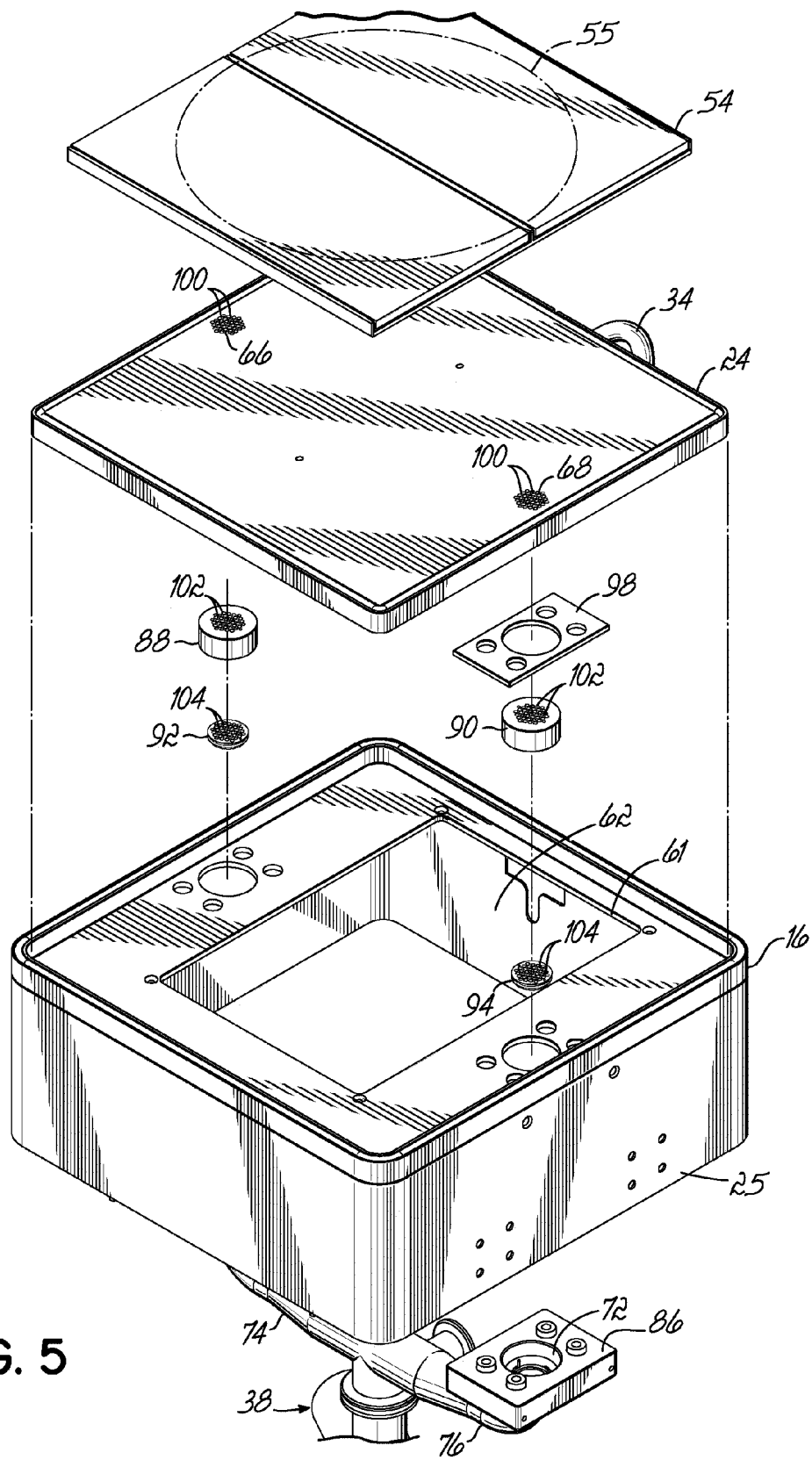
FIG. 5 is an exploded view of the enclosure base of the plasma processing system of FIG. 1.

With reference to FIGS. 3A and 5, the lower electrode 24 includes a laterally-spaced pair of vacuum ports 66, 68 each of which is positioned to coincide spatially with one of flanged ports 70, 72 at the ends of opposed arms 74, 76, respectively, of the vacuum manifold 38. The flanged ports 70, 72 are fastened to the lower electrode 24 by bolts (not shown) to compress respective sealing members 78, 80 and thereby form vacuum seals. The arms 74, 76 converge at a vertical tubing section 82 that leads to the vacuum pump 36. Received partially in the opening in flanged port 70 and partially inside of a mounting plate 84 surrounding port 70 is an insert 88. Similarly, received partially in the opening in flanged port 72 and partially inside of a mounting plate 86 surrounding port 72 is an insert 90. A centering ring 92, 94 is also positioned inside a corresponding one of the flanged ports 70, 72. Disposed between the base 16 and the lower electrode 24 are manifold mounting spacers 96, 98 each of which has a central opening that coincides with one of the vacuum ports 66, 68.

The identical manifold mounting spacers 96, 98 are each formed from an electrically insulating material, such as a thermoplastic elastomer (TPE), and their presence contributes to isolating the lower electrode 24 from the base 16 of the enclosure 12. The identical inserts 88, 90, which are each formed from an electrically insulating material such as a ceramic with a relatively high dielectric constant, serve to electrically isolate the lower electrode 24 from the base 16 of the enclosure 12 and the flanged ports 70, 72 of the vacuum manifold 38.

The inserts 88, 90 and, to a minor extent, the centering rings 92, 94 fill otherwise empty spaces at the juncture between the lower electrode 24 and the vacuum manifold 38. The lower electrode 24 and the vacuum manifold 38 are spaced apart due to the electrical isolation needed between the lower electrode 24 and the base 16 of enclosure 12. The presence of the inserts 88, 90 and centering rings 92, 94 prevents plasma excitation in these otherwise unfilled spaces between the vacuum manifold 38 and the lower electrode 24. The inserts 88, 90 effectively operate as a charged particle filter that confines the plasma to the processing region 40.

Figure 7:
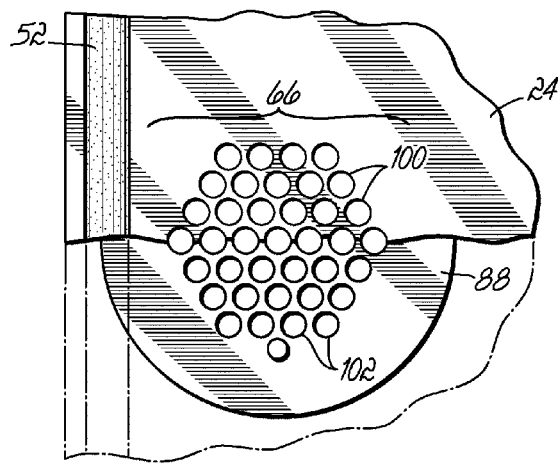
FIG. 7 is a top view taken generally along line 7-7 in FIG. 3A.

With reference to FIGS. 3A, 5, and 7, each of the vacuum ports 66, 68 in the lower electrode 24 includes an array of passages 100, respectively, which are registered with a corresponding array of passages 102, respectively, formed in a corresponding one of the inserts 88, 90 and a corresponding array of passages 104, respectively, formed in a corresponding one of the centering rings 92, 94. The vacuum pump 36 exhausts byproduct generated by the plasma process and non-reacted gas from the processing region 40 into the vacuum manifold 38 through the registered passages 100, 102, 104. The arrangement and dimensions of the passages 100, 102, 104, which typically have substantially identical arrangement and dimensions, are selected to maximize pumping conductance while simultaneously preventing plasma excitation based on the hollow cathode effect. As a result, the plasma is confined to the processing region 40, which makes efficient use of the input excitation power.

Figure 7B:
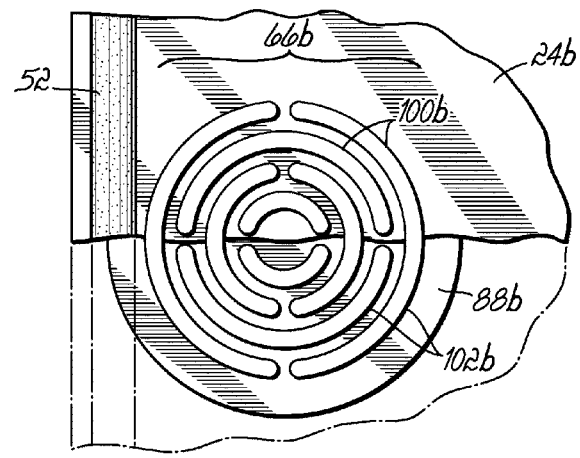
FIGS. 7A and 7B are top views similar to FIG. 7 in accordance with alternative embodiments of the invention.
Figure 7A:
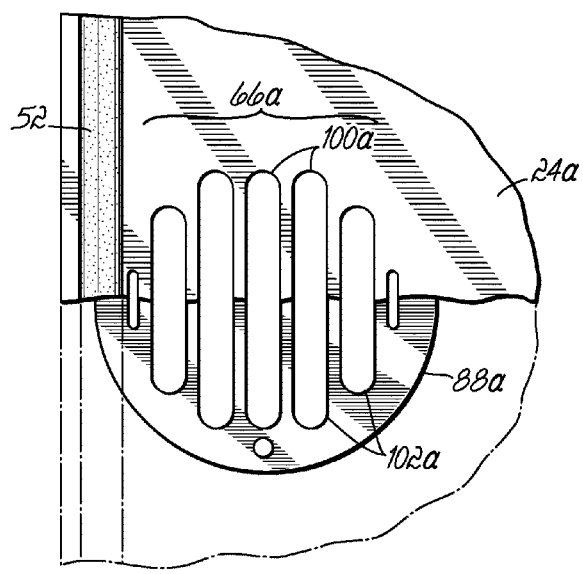

With reference to FIGS. 7A and 7B, the pattern and configuration of the passages 100, 102, 104 is not limited to the illustrated embodiment in FIG. 7 but, instead, is contemplated to include any pattern and configuration that provides suitable pumping conductance without plasma excitation. Generally, the passages 100, 102, 104 are spaced apart in a direction normal to that of the flow of the exhausting gases. In one specific alternative embodiment and with specific reference to FIG. 7A, the passages 102a in a representative insert 88a and the passages 100a in a representative vacuum port 66a of a lower electrode 24a are configured as a set of parallel slots. The passages in a centering ring (not shown) are configured to coincide with the passages 100a, 102a. In one specific alternative embodiment of the invention and with specific reference to FIG. 7B, the passages 102b in a representative insert 88b and the passages 100b in a representative vacuum port 66b of a lower electrode 24b are configured as a set of concentric curved slots. The passages in a centering ring (not shown) are configured to coincide with the passages 100b, 102b.

Figure 6:
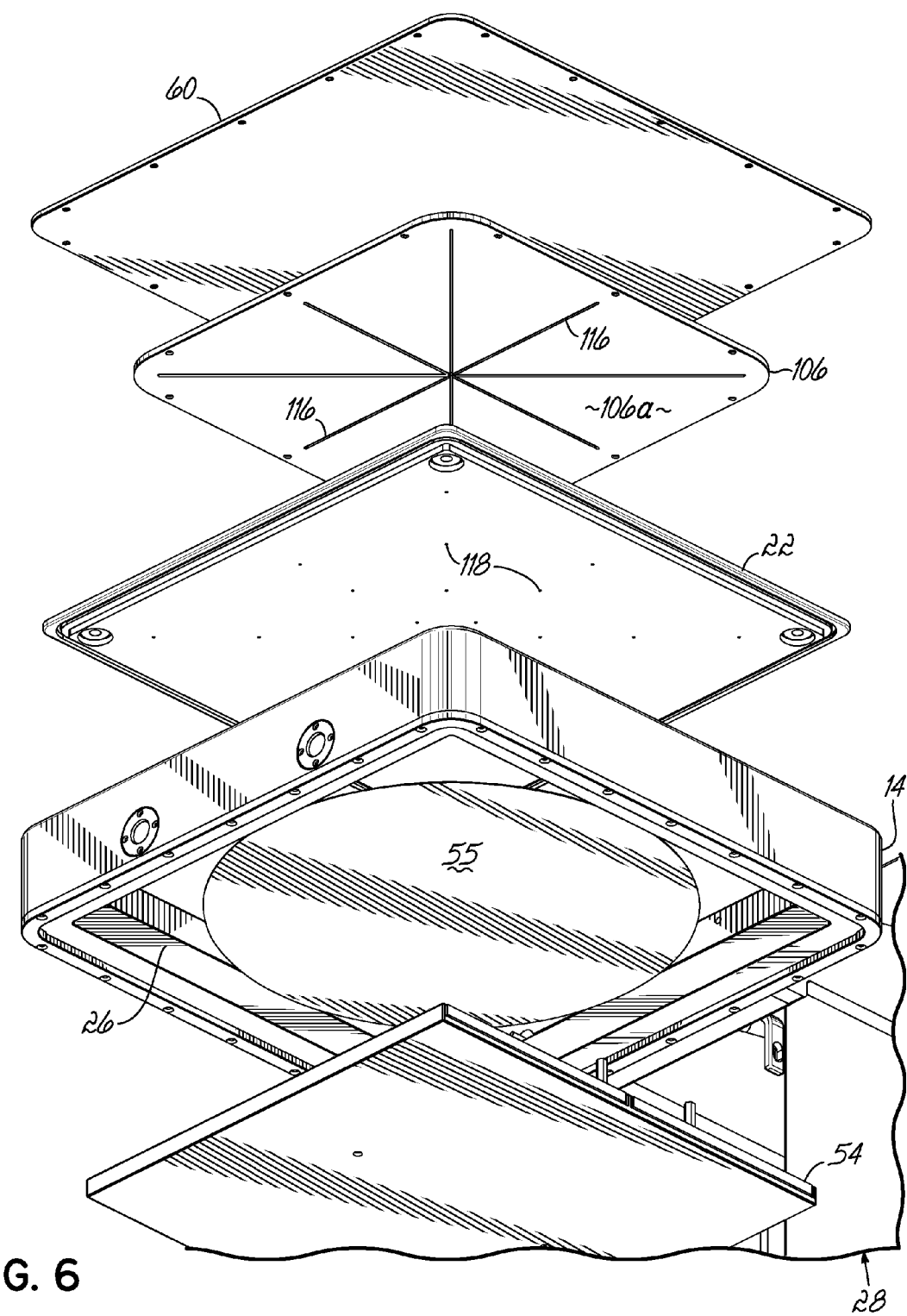
FIG. 6 is an exploded view of the enclosure lid of the plasma processing system of FIG. 1.

With reference to FIGS. 4 and 6, fastened to an upper horizontal surface of the upper electrode 22 is a gas inlet plate 106. Extending through the gas inlet plate 106 is a gas port 108 (FIG. 4) coupled by a conduit 110 with a fitting 112. Fitting 112 is further coupled by a delivery line 113 with a process gas supply 114 (FIG. 2). The delivery line 113 and process gas supply 114 may include a mass flow controller and a flow measurement device (not shown) that cooperate for regulating the flow rate of each individual process gas to the processing region 40. A planar surface 106a of the gas inlet plate 106 facing the upper electrode 22 includes a plurality of recessed radial channels 116 that intersect at and diverge away from the location of the gas port 108. Extending through the upper electrode 22 is a plurality of perforations or gas openings 118 arranged in a pattern such that each gas opening 118 is registered with one of the radial channels 116 in the gas inlet plate 106 when the gas inlet plate 106 is fastened to the upper electrode 22. A conventional sealing member 120, illustrated as an elastomeric o-ring, provides a seal about the adjacent perimeters of the gas inlet plate 106 and the upper electrode 22.

Process gas supplied to the gas port 108 is distributed among the radial channels 116 to the gas openings 118. The process gas is admitted to the processing region 40 through gas openings 118 positioned with spaced-apart locations above the lower electrode 24 and across the substrate 55 supported on the substrate holder 54. The gas distribution may be tailored for a specific processing application by inserting a plug 122 into one or more of the gas openings 118 that is effective to block process gas flow. In one embodiment of the invention, the gas openings 118 may be threaded and the plug 122 may be an appropriately-sized set screw. The adjustment of the gas distribution may be empirically determined by examining the process uniformity on processed substrates 55. The flow of process gas into the processing region 40 and the pumping rate of vacuum pump 36 are coordinated to maintain the total gas pressure in the processing region 40 at a level low enough to facilitate plasma creation from the partial pressure of process gas.

The gas distribution system of the invention promotes uniform distribution of the process gas across the substrate 55 and has the flexibility to permit adjustments to the pattern of gas distribution. In alternative embodiments of the invention, the process gas may be supplied to the processing region 40 by a different type of gas distribution system, such as a gas distribution ring, gas injectors, a single gas port, etc.

The invention contemplates that electrode 22 may be configured to produce an ion-free or downstream plasma in the processing region 30. A suitable configuration for electrode 22 is disclosed in commonly-owned and currently pending application Ser. No. 10/324,436, filed Dec. 20, 2002 in the name of James Scott Tyler et al. and entitled "Plasma Treatment System", which is hereby incorporated by reference herein in its entirety.

References herein to terms such as "vertical", "horizontal", etc. are made by way of example, and not by way of limitation, to establish a frame of reference. The term "horizontal" as used herein is defined as a plane substantially parallel to a plane containing one of the confronting surfaces of the electrodes 22, 24, regardless of orientation. The term "vertical" refers to a direction perpendicular to the horizontal, as just defined. Terms, such as "upper", "lower", "on", "above", "below", "side" (as in "sidewall"), "higher", "lower", "over", "beneath" and "under", are defined with respect to the horizontal plane. It is understood various other frames of reference may be employed without departing from the spirit and scope of the invention as a person of ordinary skill will appreciate that the defined frame of reference is relative as opposed to absolute.

Figure 8:
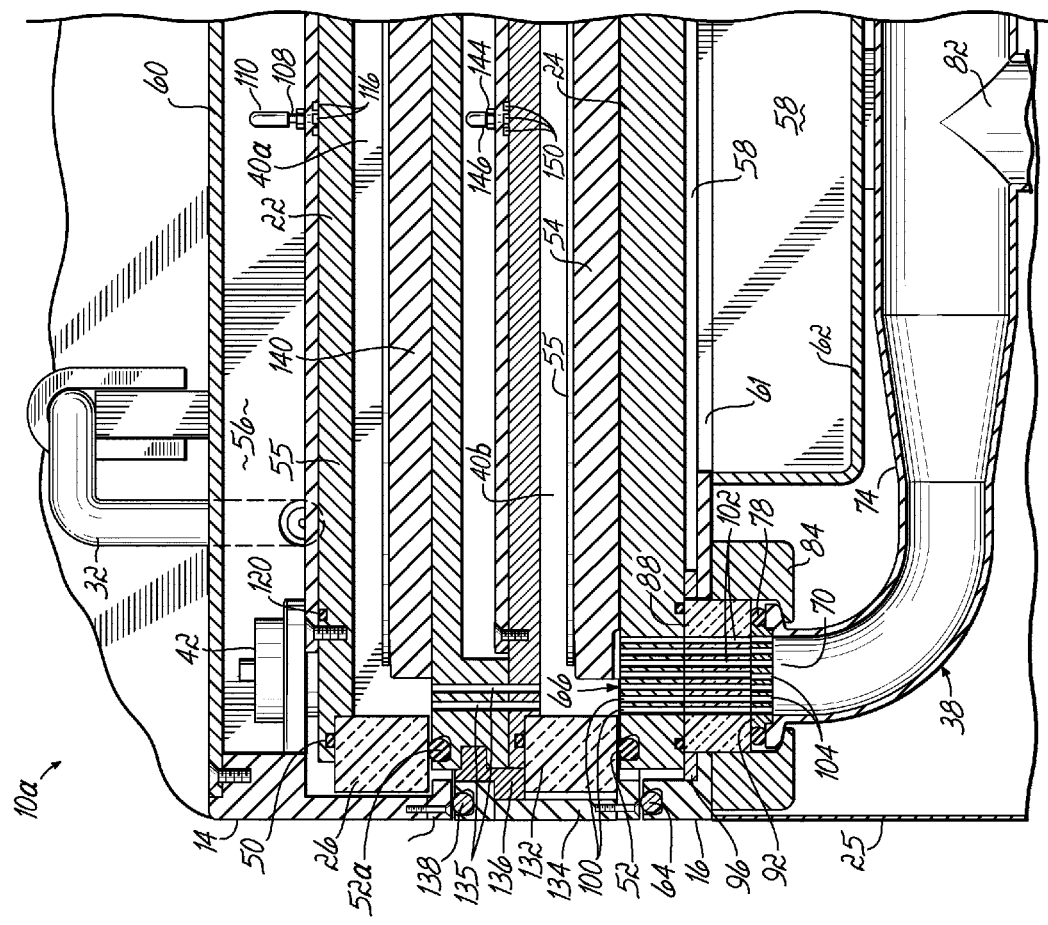
FIGS. 8 and 9 are front and side cross-sectional views similar to FIGS. 3A and 4 of a plasma processing system in accordance with an alternative embodiment of the invention.
Figure 9:
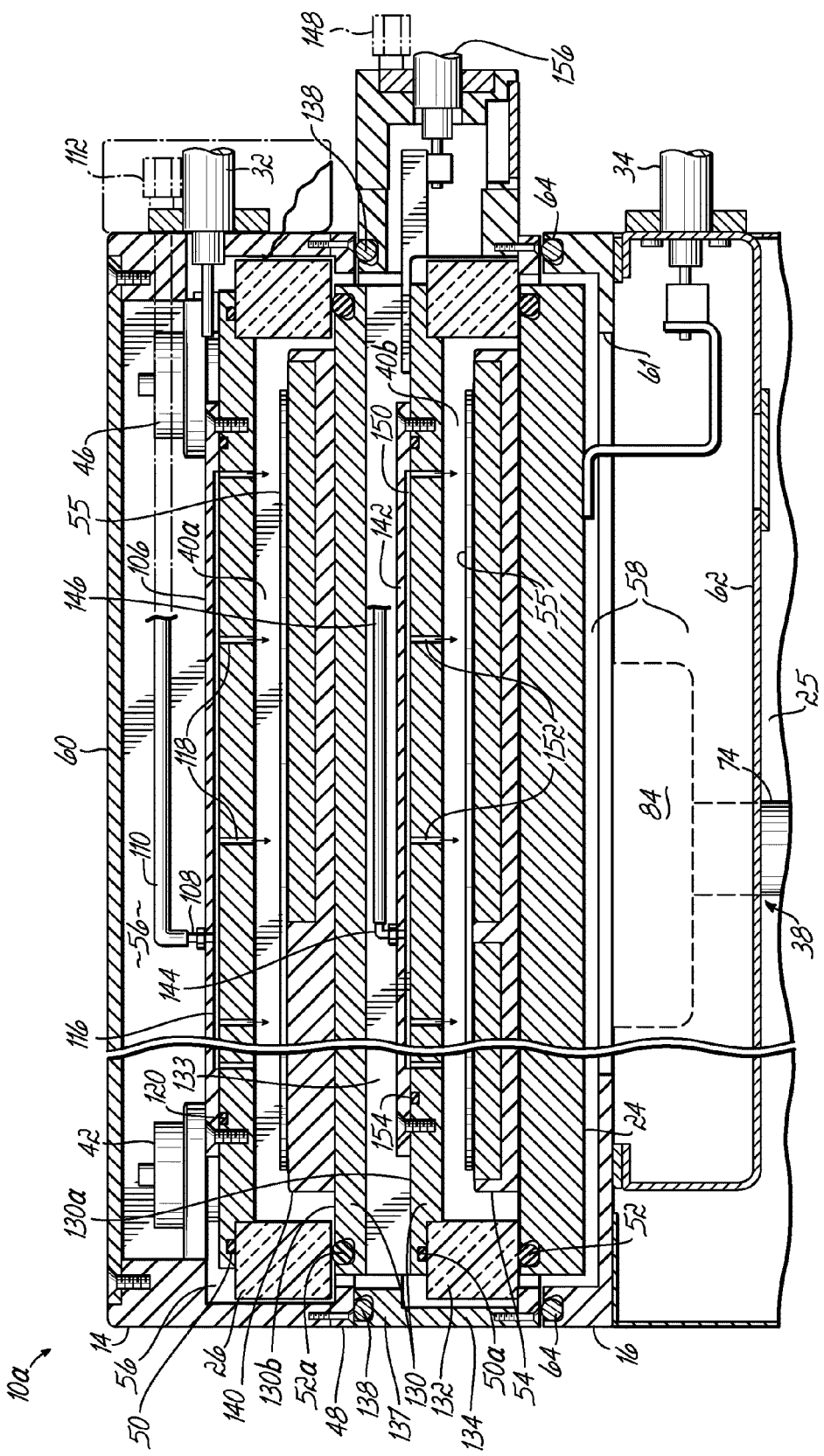

With reference to FIGS. 8 and 9 in which like reference numerals refer to like features in FIGS. 1-7 and in accordance with an alternative embodiment of the invention, a plasma processing system 10a features a second processing level stacked vertically in relationship with the first processing level. This increases the workpiece capacity of system 10a for a single processing operation and expands the system throughput as compared with system 10 (FIGS. 1-7). The second level is provided by inserting an intermediate electrode 130 between upper and lower electrodes 22, 24 and adding an additional separating member or ring 132 that is substantially identical to separating ring 26. Electrode 130 and separating ring 132 are carried by a frame 134 and electrically insulated from the frame 134 by electrically insulating member 136 (FIG. 8).

A lifting device (not shown) similar to lifting device 28 (FIGS. 1 and 2) vertically lifts and lowers the frame 134 relative to the base 16 after the lid 14 is moved to a raised position (FIG. 3A). This provides access to a processing space consisting of, when the lid 14 and frame 134 are in a lowered position (FIGS. 8 and 9), a first portion 40a bounded by the upper electrode 22, the separating ring 26, and the intermediate electrode 130 and a second portion 40b bounded by the lower electrode 24, the intermediate electrode 130 and the separating ring 132.

The frame 134 constitutes a portion of the enclosure 12 in this alternative embodiment and is separated from the electrode 130 and separating ring 132 by an air gap 133 that is continuous with air gaps 56, 58. When the lid 14 is in its lowered position, a conducting member 138, which is similar or identical to conducting member 64, is captured between the respective perimeters of the frame 134 and lid 14. Conducting member 64 now is captured between the respective perimeters of frame 134 and base 16. The lid 14, base 16, closure 62 and frame 134 collectively define a substantially closed electrically conducting shell, which acts as a shield to confine power supplied to the electrodes 22, 24 within the interior of the enclosure 12.

The two portions 40a,b of the processing space communicate by an array of passages 135 (FIG. 9) arranged about the periphery of the intermediate electrode 130. Processing space 40b is evacuated directly through vacuum ports 66, 68 and processing space 40a is pumped through passages 135. In analogy to processing space 40 (FIGS. 3-7), processing space 40a,b represents the only evacuated volume of system 10 and provides various advantages and benefits identical to those described above for system 10. The invention is not limited to two processing levels as additional levels may be introduced in a consistent manner.

A sealing member 50a, which is similar or identical to sealing member 50, is compressed between separating ring 132 and a perimeter of the lower section 130a of the intermediate electrode 130 by a vertical force applied by a retaining ring 137. A sealing member 52a, which is similar or identical to sealing member 52, is compressed between the separating ring 26 and a perimeter of the upper section 130b of the intermediate electrode 130. Sealing member 52 is now compressed between separating ring 132 and the lower electrode 24.

The frame 134 is mounted to a lifting device (not shown) that lifts an assembly including electrode 130 and separating ring 132 relative to base 14. After the lid 14 of enclosure 12 is lifted relative to electrode 130, the assembly including electrode 130 and separating ring 132 may be moved relative to base 16 for accessing a substrate holder 138 mounted to electrode 130. The substrate holder 140, which is identical to substrate holder 54, is configured to support either one or more substrates 55 or one or more carriers each bearing one or more substrates 55 at locations suitable for plasma treatment inside the processing region 40a. Similarly, substrate holder 54 now holds substrates 55 supports either one or more substrates 55 or one or more carriers each bearing one or more substrates 55 at locations suitable for plasma treatment inside the processing region 40b.

The intermediate electrode 130 includes a lower section 130a configured similar to upper electrode 22 with a gas distribution system that evenly and uniformly distributes process gas into processing space 40b and an upper section 130 carrying substrate holder 140. The lower section 130a of the intermediate electrode 130 includes a gas inlet plate 142, which is similar or identical to gas inlet plate 106, having a gas port 144 coupled by a conduit 146 with a fitting 148, which is further coupled with process gas supply 114 (FIG. 2). A planar surface of the gas inlet plate 142 facing the lower section 130a of intermediate electrode 130 includes a plurality of recessed radial channels 150, which are similar or identical to channels 116, that intersect at and diverge away from the location of the gas port 144. Extending through the lower section 130a is a plurality of perforations or gas openings 152, which are similar or identical to gas openings 118, arranged in a pattern such that each gas opening 152 is registered with one of the radial channels 150 in the gas inlet plate 142. A conventional sealing member 154, illustrated as an elastomeric o-ring, provides a seal about the adjacent perimeters of the gas inlet plate 142 and the lower section 130a of intermediate electrode 130. In this embodiment of the invention, gas openings 118 now uniformly distribute process gas across the confronting surface of workpiece 55 in processing region 40a and, in a similar manner, gas openings 152 distribute process gas across the confronting surface of workpiece 55 in processing region 40b.

A transmission line 156 is electrically coupled in a known manner with the intermediate electrode 130. Typically, all three electrodes 22, 24, and 130 are coupled with the power supply 30 and, if the power supply 30 is an alternating current power supply, the middle electrode 130 is driven 180° out of phase from the other electrodes 22, 24.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants" general inventive concept. The scope of the invention itself should only be defined by the appended claims, wherein we claim:

We claim:

1. An apparatus for processing a substrate with a plasma, the apparatus comprising:
    a first electrode;
    a second electrode;
    a separating member directly contacting said first electrode and directly contacting said second electrode and forming a sidewall extending from said first electrode to said second electrode, said separating member composed of a dielectric material capable of electrically isolating said first electrode from said second electrode;
    a processing region formed by said separating member, said first electrode, and said second electrode;
    a process gas port for introducing a process gas to said processing region;
    a vacuum port in said first electrode for evacuating said processing region to a sub-atmospheric pressure suitable for generating the plasma from the process gas in said processing region;
    an electrically conductive shell surrounding said first electrode, said second electrode, and said separating member; and
    an atmospheric pressure space between said shell and said first electrode, said second electrode, and said separating member.

2. The apparatus of claim 1 further comprising:
    a vacuum manifold coupled with said vacuum port, said vacuum manifold being electrically isolated from said first electrode and said second electrode.

3. The apparatus of claim 2 wherein said vacuum manifold includes an enclosed volume proximate to said vacuum port and further comprising:
    an insert of an electrically insulating material positioned inside said enclosed volume, said insert including a first plurality of passages coupling said vacuum manifold with said vacuum port.

4. The apparatus of claim 3 wherein said vacuum port is defined by a second plurality of passages extending through said first electrode and registered with said first plurality of passages.

5. The apparatus of claim 1 further comprising:
    a vacuum pump coupled with said vacuum port and operative for evacuating said processing region to said pressure suitable for generating the plasma from the process gas in said processing region.

6. The apparatus of claim 1 further comprising:
    a process gas supply coupled with said process gas port for introducing the process gas to said processing region.

7. The apparatus of claim 1 wherein said second electrode includes a plurality of openings arranged in a pattern effective for communicating process gas from said process gas port to said processing region.

8. The apparatus of claim 1 wherein said shell includes a base and a lid movable relative to said lid between opened and closed positions for accessing said processing region, said lid carrying said second electrode for movement relative to said base.

9. The apparatus of claim 1 further comprising a coolant port in said lid configured for supplying a flow of a coolant fluid to said atmospheric pressure space for cooling said first electrode and said second electrode.

10. The apparatus of claim 1 wherein said second electrode includes said process gas port.

11. The apparatus of claim 10 wherein said second electrode includes a plurality of gas openings coupled with said process gas port, said plurality of gas openings positioned in said second electrode to distribute process gas across a confronting surface of the substrate.

12. An apparatus for plasma processing a plurality of substrates, the apparatus comprising:
    a first electrode;
    a second electrode positioned with a spaced apart relationship relative to said first electrode;
    a third electrode positioned between said first electrode and said second electrode;
    a first separating member directly contacting said first electrode and directly contacting said third electrode forming a first sidewall extending between said first electrode and said third electrode, said first electrode configured to support one of the plurality of substrates in said first processing region for plasma processing, and said first separating member comprising a dielectric material for electrically isolating said first electrode from said third electrode;
    a first processing region formed by said first separating member, said first electrode, and said third electrode;
    a second separating member directly contacting said second electrode and directly contacting said third electrode forming a second sidewall extending between said second electrode and said third electrode, said second electrode configured to support one of the plurality of substrates in said second processing region for plasma processing, and said second separating member comprising a dielectric material for electrically isolating said second electrode from said third electrode;
    a second processing region formed by said second separating member, said second electrode, and said third electrode;
    at least one process gas port for introducing a process gas to said first processing region and second processing region;
    a vacuum port in said first electrode for evacuating said first and second processing regions to a sub-atmospheric pressure suitable for generating the plasma from the process gas in said first processing region and said second processing region;
    an electrically conductive shell surrounding said first electrode, said second electrode, said third electrode, said first separating member, and said second separating member; and an atmospheric pressure space between said shell and said first electrode, said second electrode, said third electrode, said first separating member, and said second separating member.

13. The apparatus of claim 12 wherein said second electrode includes a first process gas port configured for introducing the process gas to said first processing region and said third electrode includes a second process gas port configured for introducing the process gas to said second processing region.

14. The apparatus of claim 1 wherein said first electrode is adapted to support the substrate in said processing region.

* * * * *